United States Patent [19]

Gorin et al.

[11] 4,209,357
[45] Jun. 24, 1980

[54] PLASMA REACTOR APPARATUS

[75] Inventors: Georges J. Gorin, Emeryville; Josef T. Hoog, Novato, both of Calif.

[73] Assignee: Tegal Corporation, Novato, Calif.

[21] Appl. No.: 40,604

[22] Filed: May 18, 1979

[51] Int. Cl.² .............................................. C23F 1/02
[52] U.S. Cl. .................................. 156/643; 156/345; 204/164; 204/192 E; 204/298; 250/531
[58] Field of Search .................. 204/164, 192 E, 298; 156/345, 643; 250/531

[56] References Cited

U.S. PATENT DOCUMENTS

| | | | |
|---|---|---|---|
| 4,094,722 | 6/1978 | Yamamoto et al. | 156/345 |
| 4,148,705 | 4/1979 | Battey et al. | 204/192 E |
| 4,149,923 | 4/1979 | Uehara et al. | 156/345 |
| 4,151,034 | 4/1979 | Yamamoto et al. | 156/345 |
| 4,158,589 | 6/1979 | Keller et al. | 156/345 |
| 4,160,690 | 7/1979 | Shibagaki et al. | 156/643 |

OTHER PUBLICATIONS

R. G. Poulsen, "Plasma Etching in Integrated Circuit Manufacture—A Review", *J. Vac. Sci. Technol,* vol. 14, pp. 266–274 (1977).
Q. T. Jarrett, "Plasma Etching of Semiconductor Wafers", *Western Electric Tech. Digest,* No. 50, p. 9, Apr. 1978.
H. M. Gartner et al., "Reaction By-Products Collection Surface for Metal & Quartz Ion Etch Systems", *IBM Tech. Disc Bull.,* vol. 20 p. 3106 (1978).
R. R. Garnache et al., "Gas Injection System", *IBm Tech. Disc. Bull.,* vol. 14, p. 255 (1972).

*Primary Examiner*—Aaron Weisstuch
*Attorney, Agent, or Firm*—John A. Fisher

[57] ABSTRACT

A plasma reactor apparatus providing improved uniformity of etching and having a totally active reaction volume. The reactor apparatus is comprised of two electrically separated electrodes which bound a reaction volume. The topmost electrode functions as both a gas distribution manifold for uniformly injecting reactant gases into the reaction volume and as an exhaust manifold for uniformly withdrawing reaction products from the reaction volume. The two electrodes are so configured that the plasma reaction takes place only between the electrodes; there is no inactive space surrounding the electrodes to fill with plasma. The configuration is thus conservative of both reactants and energy. The bottommost plate which serves as a workpiece holder is movable with respect to the upper plate to permit loading and unloading of workpieces. The uppermost plate is the active RF electrode while the workpiece holder is maintained at a RF ground potential. The uppermost plate has a larger electrode area which effectively imposes a dc offset to the RF field which enhances the uniformity of the etching and decreases the undesirable spread of undercut etching.

25 Claims, 8 Drawing Figures

PLASMA REACTOR APPARATUS

BACKGROUND OF THE INVENTION

This invention relates to a plasma reactor apparatus and more specifically to a plasma reactor apparatus which provides improved uniformity of etching and improved overetch control.

The use of plasma processing is gaining rapid acceptance as a replacement for older conventional processing. This is especially true in the semiconductor industry but is becoming equally true in other manufacturing fields as well. Plasma etching is being used in place of wet chemical etching and plasma deposition is being used in place of high temperature thermal deposition. Plasma processing offers advantages in cost, environmental impact, and repeatability.

As the use of plasma processing increases, there is a growing demand for uniformity and repeatability of the plasma process. Uniformity is essential across a single workpiece and from workpiece to workpiece. In the semiconductor industry, for example, the etching of fine lines or spaces across a semiconductor wafer must be uniform over the total area of that wafer in order to insure adequate yield of all devices on the wafer. This requirement for uniformity across the wafer becomes more stringent as the semiconductor industry matures and the designed values of lines and spaces are reduced. Repeatability from wafer to wafer is important, again to allow high yields. Processing lots do not always stay constant throughout the device process; that is, an insulator layer, for example, may be deposited on small batches of wafers which are later combined to form one large lot. As this lot then proceeds through subsequent processing steps, it is imperative that the subsequent steps be uniform and predictable.

Existing plasma reactors can be roughly divided into two types: barrel type reactors and parallel plate type reactors. In the barrel type reactor, workpieces are loaded into a cylindrical reaction chamber and a reactant plasma is introduced into that chamber. The plasma is created by a field from an electrode which surrounds the workpiece. Gas flow is approximately axial along this type of reactor and may be improved by an injection manifold which injects gases more or less uniformly along the axis. This type of reactor, however, suffers from two types of non-uniformities. One of these non-uniformities results from the external electrode which cannot provide a uniform field with respect to workpieces within the chamber. The other results from the gas flow kinetics. The plasma tends to flow through the reactor in a non-uniform manner and suffers, additionally, from plasma depletion effects. Parallel plate reactors provide a degree of improvement in uniformity over the barrel reactor by providing a more uniform and better defined field at the workpiece. The parallel plate reactor, however, still suffers from non-uniformities resulting from a non-uniform and usually radial reactant gas flow. These non-uniformities have been markedly improved in the reactor apparatus disclosed in co-pending application Ser. No. 847,349 filed Oct. 31, 1977, and assigned to the assignee of the present invention. That apparatus provides means for uniform injection of reactants into the reaction space between closely spaced parallel plates. Even with this configuration, however, non-uniformities exist because of the non-uniform removal of reaction products from the edge extremities of the reaction volume.

All of the aforementioned plasma reactors have an additional fault. The total reactor, including a considerable amount of unused volume, is filled with the reactive plasma although the workpieces occupy only a limited amount of that volume. In the cylindrical reactor, the total cylindrical chamber is filled with plasma. In the parallel plate reactor, even the volume outside the plates is filled with plasma. Filling this "dead space" with plasma is uneconomical because of wasted reactants and especially because of the extra power required to maintain this unused plasma. The power requirement is important because a given power supply must be large enough to generate both the used and unused plasma. The energy of the used plasma is unnecessarily limited because the power supply must also generate the unused or wasted plasma. More importantly, as the pressure in the reaction chamber changes the plasma volume changes, expanding unpredictably into the dead space. This presents problems with reproducibility from run to run.

Accordingly, it is an object of this invention to provide a plasma reactor apparatus which allows an enhanced uniformity across the workpiece and from workpiece to workpiece.

It is a further object of this invention to provide a reactor apparatus having a decreased "dead space".

It is a still further object of this invention to provide a plasma reactor apparatus which provides improved dimensional control of the plasma process.

It is another object of this invention to provide a plasma reactor apparatus which minimizes the standard deviation of undercutting dimensions with overetch time.

It is still another object of this invention to provide a plasma reaction process having improved dimensional control.

SUMMARY OF THE INVENTION

The attainment of these and related objects and advantages may be achieved through the use of the novel plasma reactor apparatus herein disclosed. In one embodiment of this invention a plasma reactor apparatus is provided which has first and second metal electrodes electrically separated by an insulator. These two electrodes are essentially parallel, but are shaped and positioned so that the two electrodes and the insulator bound a reaction volume. The first of the electrodes is movable with respect to the second electrode to facilitate loading and unloading workpieces into the reaction volume. A gas distribution manifold is integral with the second, larger electrode and provides for the uniform distribution of reactants into the reaction volume through an array of orifices. The manifold further provides for the uniform exhausting of reactant products through a second array of orifices. The distribution of reactants is thus uniform, the fields between the plates are uniform, and the field and plasma are confined to the limited volume between the two electrodes.

The particular elements of the invention and the benefits to be derived therefrom will be more readily apparent after review of the following more detailed description of the invention taken in connection with the drawings.

DETAILED DESCRIPTION OF THE PREFERRED EMBODIMENTS

Figure 1:
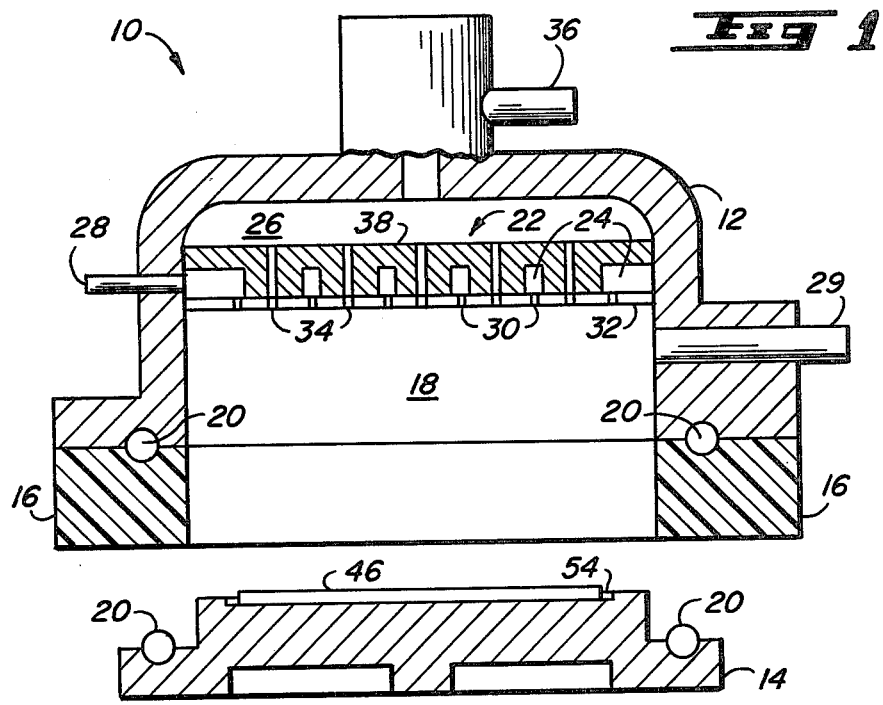
FIG. 1 shows in cross section a preferred embodiment of a reactor apparatus in accordance with the invention.

FIG. 1 shows a plasma reactor chamber 10 in accordance with one embodiment of the invention. The chamber includes a top or cover electrode 12 and a bottom plate electrode 14. Bottom plate 14 is movable in a vertical direction between the open position as shown and a closed position. When moved vertically upward to its closed position, plate 14 contacts an insulator 16 which provides electrical isolation between the electrodes. In the closed position the two electrodes and the insulator bound a small, confined reactor volume as indicated by the numeral 18. O-ring seals 20 serve to complete the seal between the electrode and the insulator. A gas distribution manifold 22 allows a uniform injection of reactant gases into the reaction volume and also allows for the uniform extraction of reaction products from that volume. The manifold 22, which will be described in more detail below, consists of a first cavity 24 and a second cavity 26. The first cavity receives reactants from a gas inlet 28. Gases which enter the cavity 24 then are uniformly injected into the reaction volume through a first set of orifices 30 in the lower plate 32 of the manifold. Reaction products, that is, spent and unused reactants as well as the chemical products resulting from the plasma reaction, are exhausted to the second cavity 26 through a second set of orifices 34 in the bottom manifold piece 32. These reaction products are then exhausted from the second cavity by a vacuum pump (not shown) through an outlet 36. The electrodes can be cast of aluminum or other metal. In this embodiment the reaction volume is about 15 cm in diameter and has a height of about 3 cm. The bottom plate is provided with a recess 54 for centering a workpiece. The bottom plate can further be provided with temperature control means (not shown) for either heating or cooling the workpiece. A radio frequency (rf) generator is provided which contacts the two electrodes and establishes an rf field between them. The manifold 22 is electrically common with the cover electrode 12. Because the manifold and the bottom plate are substantially parallel, the field established between them is fairly uniform. The field and the resulting plasma are confined to the region between the electrodes; there is no wasted "dead space". A detector 29 is used to monitor the end point of the plasma reaction.

Figure 2:
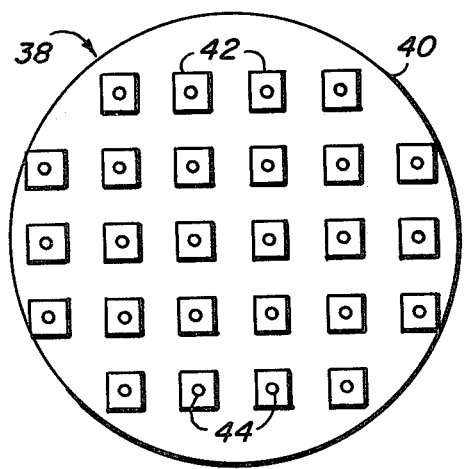
FIGS. 2-4 show details of the reactant distribution manifold in bottom, side and exploded perspective view, respectively.
Figure 3:
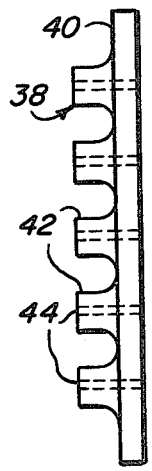
Figure 4:
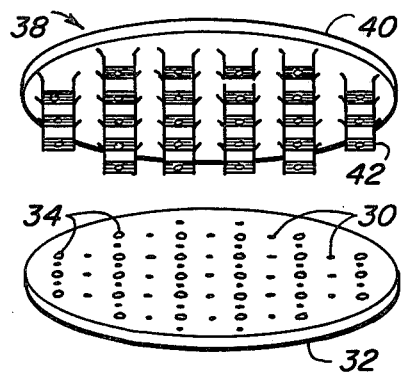

The gas manifold 22 with its two cavities 24, 26 is made up of three components. These are the bottom piece 32, an intermediate piece 38, and a portion of top cover plate 12. The details of the construction of the manifold are shown more clearly in FIGS. 2-4. FIGS. 2 and 3 show bottom and side views, respectively, of the intermediate plate 38. Plate 38 which can be machined from a single piece, cast, or built up from components, is essentially a flat plate 40 from which a series of posts 42 project. The posts 42 are arranged in a regular array. A hole 44 extends through each of the posts. Holes 44 mate with the orifices 34 in the bottom plate 32 and provide a conduit for the passage of reaction products from the reaction chamber 18 to second cavity 26 bounded by the intermediate plate and the top cover plate. The space between the posts and bounded by plates 32 and 40 constitute the first cavity 24. Reaction gases enter through inlet 28, fill cavity 24, and then are injected into the reaction volume through the orifices 30 in bottom plate 32. Orifices 30 are a regular array of holes through the bottom plate 32 and provide for the uniform injection of reactant gases into the reaction volume.

Figure 5:
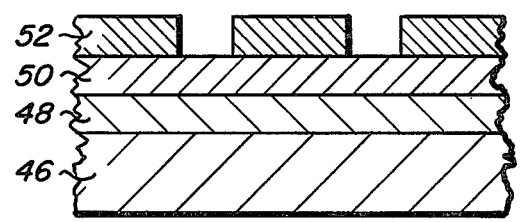
FIGS. 5 and 6 schematically show in cross section a portion of a semiconductor wafer etched in accordance with the process of the invention.

As a non-limiting example of the use of the plasma reactor apparatus in accordance with the invention, consider a semiconductor wafer 46, a portion of which is shown in cross-section in FIG. 5. Overlying the semiconductor wafer is first a layer of silicon dioxide 48 and then a layer of polycrystalline silicon 50. During the processing of the semiconductor wafer it is desirous to etch through and pattern polycrystalline layer 50. This is done photolithographically by applying and patterning a layer of photoresist material 52. The pattern in the photoresist layer 52 is that pattern which it is desired to replicate in the underlying layer of polycrystalline silicon. The semiconductor wafer is placed in a depression 54 of the lower plate 14 of the plasma reactor apparatus and the lower plate is raised to its closed position so that the wafer is enclosed within the plasma reactor apparatus. Reaction volume 18 is evacuated through exhaust 36 using a vacuum pump. Reactant gases, such as a mixture including nitrogen, oxygen and carbon tetrafluoride are brought into the reactor through inlet 28 and cavity 24. These reactants are uniformly injected into the reaction volume through orifices 30 so that wafer 46 is subjected to a uniform flow of reactant. The pressure within the reaction volume is maintained at about 1.5 Torr by balancing the reactant input and the evacuation through outlet 36. Wafer temperature is maintained at about 60° C. by means of a heater in the bottom plate 14. Seventy-five watts of RF power are applied to the top cover plate 12 and the bottom plate is maintained at RF ground potential. The RF power creates a plasma of the reactant gases and this plasma chemically etches the polycrystalline silicon 50 which is exposed through the opening in the patterned photoresist layer 52. As the plasma chemically etches the polycrystalline silicon the reaction products are removed from the reaction volume 18 through the array of orifices 34. The reaction products pass through these orifices to cavity 26 from which they are swept out through exhaust 36 by the vacuum pump. A layer of polycrystalline silicon about 500 nanometers in thickness is patterned in approximately 2 minutes 15 seconds.

Figure 6:
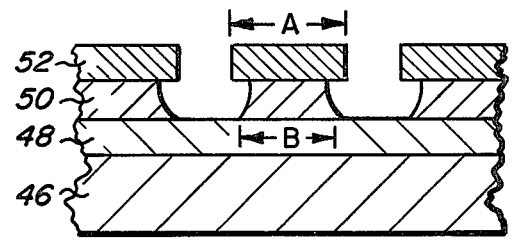

FIG. 6 shows the relationship between the patterned photoresist layer and the resulting etched polycrystalline silicon layer at the end of the process. The masking layer of photoresist tends to be undercut; that is, the resulting patterned polycrystalline silicon is narrower than the original photoresist mask. If the width of the original photoresist mask is defined as A and the resulting width of the polycrystalline silicon is defined as B, the amount of undercutting D can be defined as A−B.

Figure 7:
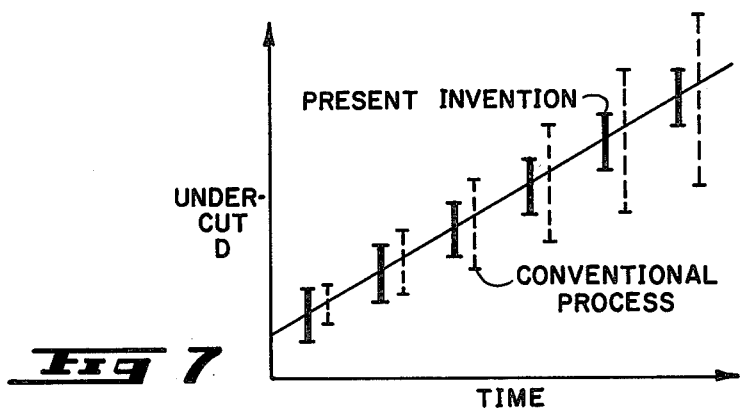
FIG. 7 is a graph showing the relationship between undercutting and overetch time.

Some amount of undercutting will invariably result with this type of etching, and the amount of undercutting will increase with the amount of overetch time. If it takes 2 minutes 15 seconds to etch through the polycrystalline film, the amount of undercutting D will increase as the plasma reaction is allowed to continue beyond this time. Some amount of overetch is usually allowed to insure that the layers etch completely through, making allowances for variations in film thickness across the wafer and from workpiece to workpiece. Some overetch time can also be used to achieve desired, narrow line widths. The photographic mask used to expose the photoresist layer can be controlled to give line widths within about 10% of the desired width, with the usual tendency to be oversized. Normal photoresist processing and exposure further tends to oversize the photoresist mask. These two tendencies thus result in the necessity for some overetch in order to obtain the desired line width. If any overetch time is employed, however, it is desirable that there be a minimum spread in the amount of undercutting D with overetch time. FIG. 7 shows the resultant undercutting as a function of overetch time for conventional processing and for processing in accordance with the invention. Each process leads to a linear relationship between undercutting and overetch time as indicated by the straight line. There is, however, a significant difference in the spread or scatter in the undercutting as the etch time increases. The spread increases rapidly with etch time in conventional processing, but the spread in D remains approximately constant and thus predictable with the process performed in the apparatus of the instant invention. The spread in D of the two different processes is indicated by the error bars shown in the graph of FIG. 7. Minimizing the spread in D makes the process more predictable and reproducible.

It is believed that the control in uniformity and the control in undercutting results from the combination of several factors inherent in the design of the plasma reactor in accordance with the invention. First, manifold 22 provides for uniform distribution of reactants across the area of the workpiece. This is accomplished by the uniform injection of reactants and by the uniform exhausting of reactant products. Second, the closely spaced, substantially parallel electrodes provide for a uniform RF field within the reaction volume. And third, the ratio of the areas of the two electrodes gives further added advantages. The bottom plate forms one electrode of the system while the cover portion and distribution manifold form the other, larger electrode. It is desirable that the ratio of electrode areas be greater than about 1.2; this results in a positive ion bombardment which appears to enhance the chemical etching. The workpiece sits on the small electrode (cathode) in an RF diode system and receives the enhanced positive ion bombardment which is essential to certain high resolution etching. At these power levels and pressures no appreciable amount of either sputter etching or ion milling occurs, but the ion bombardment seems to catalyze the chemical etching. The area ratio provides an effective DC bias because of the mobility difference between electrons and positive ions within the plasma. An external DC bias cannot accomplish the same result because the workpiece is often insulated, for example, by an oxide layer, and thus is isolated from the workpiece holder. The area ratio further results in a high current density on the bottom electrode which provides for a thick plasma sheath. The thick sheath and the effective DC bias give a directed ion bombardment on the wafer. Because the ion bombardment is directed, it impinges only on those portions of the layer to be etched which are exposed by openings in the photoresist mask. Thus the enhanced chemical etching resulting from this bombardment occurs only in the exposed areas and undercut etching is minimized.

Figure 8:
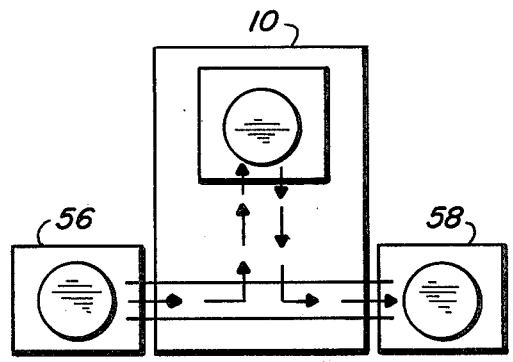
FIG. 8 schematically shows a further embodiment of the invention which provides for automation of the plasma process.

The apparatus shown above is most suitable for the etching of a single workpiece. In those instances, such as in the semiconductor industry, in which it is desirable to etch a large number of similar workpieces, the apparatus can be automated as indicated schematically in FIG. 8. For semiconductor wafers, a cassette filled with wafers can be loaded into the input 56 of an automatic apparatus. Wafers are then conveyed one at a time to the reactor apparatus 10 on belts, air bearing tracks, or the like. As the wafer arrives at the reactor, the bottom plate is lowered to the open position, the wafer is loaded on that bottom portion, and the chamber is closed. Automatic controls provide for the timely opening and closing of the chamber, inputting of reactant gases, and turning on and off of the RF power. Following the completion of the etching of that single wafer, the chamber again opens and the wafer is conveyed to another cassette in an output station 58. The entire operation can be accomplished with little operator interaction. Because of the uniformity of the etching, the etch time can be established for a particular process step and all of the wafers in the batch can be etched identically.

Thus it is apparent that there has been provided, in accordance with the invention, an improved plasma reactor apparatus and method that fully satisfies the objects and advantages set forth above. The invention has been described in conjunction with specific preferred embodiments but it is evident that many alternatives, modifications and variations will be apparent to those skilled in the art in the light of the foregoing description. The apparatus has been described, for example, in an embodiment most suitable to the etching of layers on a semiconductor wafer. Appropriate modifications in the size and shape of the reactor apparatus, however, can be made to accomodate other workpieces including, for example, fine machine parts, optical equipment, or the like. The apparatus and process are adaptable for the etching of a variety of materials by properly selecting reactant gases, power levels, pressure, and etch temperature. In contrast to the specific example given, the top electrode, rather than the lower plate can be maintained at rf ground potential. The reactor apparatus can also be used for the implementation of related processes such as reactive ion etching which is carried out at lower pressures than plasma etching and combines chemical energy from the gas and physical energy from the ions to accomplish the etching. Although contemplated primarily for uniform etching, the apparatus can be further employed for the deposition of thin uniform films. Accordingly, it is intended that the invention embrace all such alternatives, modifications and variations as fall within the spirit and scope of the following claims.

We claim:

1. A gas plasma reactor apparatus which comprises: first and second electrodes configured to bound a reaction volume which is adapted to be evacuated, said first electrode having a first array of orifices for the ingress of gaseous reactants to said reaction volume and a second array of orifices for the egress of gaseous reaction products from said reaction volume.

2. The reactor apparatus of claim 1 wherein one of said first and second electrodes is of greater area than the other of said first and second electrodes.

3. The reactor apparatus of claim 1 further comprising means for supplying radio frequency power to said first and second electrodes.

4. The reactor apparatus of claim 3 wherein said second electrode is adapted to be maintained at radio frequency ground potential.

5. The reactor apparatus of claim 4 wherein said first electrode has a greater area than said second electrode.

6. The reactor apparatus of claim 1 wherein said second electrode is moveable with respect to said first electrode to facilitate the loading and unloading of a workpiece into said reaction volume.

7. The reactor apparatus of claim 6 wherein said first electrode is capable of further serving as a workpiece holder.

8. The reactor apparatus of claim 1 wherein substantial portions of said first and second electrodes are parallel.

9. The reactor apparatus of claim 1 further comprising temperature control means.

10. The reactor apparatus of claim 1 further comprising means for automatically loading a workpiece into said reaction volume.

11. The reactor apparatus of claim 10 further comprising means for automatically unloading a workpiece from said reaction volume at the conclusion of a plasma process.

12. The reactor apparatus of claim 1 further comprising means for detecting the end point of a plasma reaction.

13. A gas plasma reactor apparatus which comprises: a first metal electrode; and a second metal electrode of smaller area than said first electrode, said second electrode movable with respect to said first electrode from a closed position to an open position, said first and second electrodes bounding a reaction volume which is adapted to be evacuated when in said closed position and permitting loading of a workpiece into said reaction volume when in said open position; a source of radio frequency energy connected to said first and said second electrodes and capable of establishing an electrical field therebetween; a gas distribution manifold integral with said first electrode for providing introduction dispersal and exhaust of gaseous reactants in said reaction volume.

14. The plasma reactor apparatus of claim 13 further comprising: means for automatically loading a workpiece into and unloading a workpiece from said reaction volume.

15. A gas plasma reactor apparatus comprises:
a first plate portion, capable of supporting a workpiece;
a second cover portion;
an insulator positioned between and electrically separating said plate portion and said cover portion, said plate portion, insulator and cover portion bounding a reaction volume which is adapted to be evacuated;
a manifold electrically common with said cover portion, said manifold having a first set of orifices for dispensing reactant gas into said reaction volume and a second set of orifices for removing gaseous reactant products from said reaction volume.

16. The reactor apparatus of claim 15 further comprising means connected to said first plate portion and said second cover portion for establishing an RF electric field between said manifold and said plate portion.

17. The reactor apparatus of claim 15 wherein said plate portion and said cover portion are metal and said cover portion has a greater area than said plate portion.

18. A combined electrode and gas distribution manifold for maintaining a uniform distribution of reactants in a gas plasma reactor apparatus, comprising: a first cavity bounded by a first piece and a second piece; a second cavity bounded by said second piece and a third piece; an inlet for conveying reactants to said first cavity; a first array of orifices in said first piece for dispersing gaseous reactants from said first cavity into said reactor apparatus; and a second array of orifices in said first piece for exhausting gaseous reaction products from said reactor apparatus to said second cavity.

19. The apparatus of claim 18 further comprising conduit means integral with said second piece for conveying said reaction products from said second array of orifices to said second cavity.

20. The apparatus of claim 18 wherein said first piece is fabricated from metal and is electrically common with said third piece.

21. A process for the gas plasma etching of a workpiece which comprises the step of: positioning the workpiece between substantially parallel electrodes bounding a reaction volume; injecting gaseous reactants from a manifold integral with one of said electrodes into said reaction volume; applying radio frequency power to said electrodes to establish a field therebetween and to form a plasma of said reactants for etching said workpiece; exhausting gaseous reaction products of said etching through said manifold.

22. The process of claim 21 further comprising the steps of automatically loading said workpiece into said reactor; and automatically unloading said workpiece from said reactor after said etching is completed.

23. The process of claim 21 wherein said workpiece is a semiconductor wafer.

24. The process of claim 21 further comprising the step of controlling the temperature of said workpiece.

25. The process of claim 21 further comprising the step of controlling the pressure within said reaction volume.

* * * * *